(12) United States Patent
Kawaguchi

(10) Patent No.: US 10,617,050 B2
(45) Date of Patent: Apr. 7, 2020

(54) COMPONENT MOUNTER

(71) Applicant: FUJI CORPORATION, Chiryu-shi (JP)

(72) Inventor: Koji Kawaguchi, Kasugai (JP)

(73) Assignee: FUJI CORPORATION, Chiryu-shi (JP)

( * ) Notice: Subject to any disclaimer, the term of this patent is extended or adjusted under 35 U.S.C. 154(b) by 293 days.

(21) Appl. No.: 15/738,308

(22) PCT Filed: Jun. 25, 2015

(86) PCT No.: PCT/JP2015/068306
§ 371 (c)(1),
(2) Date: Dec. 20, 2017

(87) PCT Pub. No.: WO2016/208026
PCT Pub. Date: Dec. 29, 2016

(65) Prior Publication Data
US 2018/0192555 A1    Jul. 5, 2018

(51) Int. Cl.
*B23P 19/00*   (2006.01)
*H05K 13/04*   (2006.01)
*B65G 47/91*   (2006.01)

(52) U.S. Cl.
CPC ....... *H05K 13/0408* (2013.01); *B65G 47/914* (2013.01); *H05K 13/041* (2018.08); *H05K 13/0409* (2018.08); *Y10T 29/53191* (2015.01)

(58) Field of Classification Search
CPC ............. H05K 13/0409; H05K 13/041; H05K 13/0408; H05K 13/0413; H05K 13/0815;
(Continued)

(56) References Cited

U.S. PATENT DOCUMENTS 9,452,897 B2 * 9/2016 Nishiyama ......... H05K 13/0413
9,642,295 B2 * 5/2017 Teshima ............. H05K 13/0469
(Continued)

FOREIGN PATENT DOCUMENTS

JP    2005-150638 A    6/2005

OTHER PUBLICATIONS

International Search Report dated Oct. 6, 2015, in PCT/JP2015/068306, filed Jun. 25, 2015.

*Primary Examiner* — Thiem D Phan
(74) *Attorney, Agent, or Firm* — Oblon, McClelland, Maier & Neustadt, L.L.P.

(57) ABSTRACT

In a component mounter, a gap between adjacent circular plate sections of nozzles is large enough such that a pressing roller is able to pass through in a vertical direction. Therefore, the size of a circular plate section can be made relatively small, and a rotary head can be made small. A horizontal protrusion overlaps with one or both of adjacent ring-shaped protrusions of the nozzle when viewed from above in a case in which the pressing roller is positioned between adjacent circular plate sections of nozzles. In a state with the pressing roller positioned above the gap between adjacent circular plate sections of nozzles, even if power to a Z-axis linear actuator is cut such that the raising and lowering member suddenly loses support and falls, the horizontal protrusion of the raising and lowering member engages with and stops the ring-shaped protrusion of the nozzle.

5 Claims, 6 Drawing Sheets

(58) Field of Classification Search
CPC ......... Y10T 29/53178; Y10T 29/53174; Y10T 29/53191; Y10T 29/49998; Y10T 29/53; Y10T 29/5313; Y10T 29/4913
USPC .................. 29/743, 739, 740, 829, 832, 834
See application file for complete search history.

(56) References Cited

U.S. PATENT DOCUMENTS 10,506,749 B2* 12/2019 Kawaguchi ............ H05K 13/08
2005/0115063 A1 6/2005 Saito et al.

* cited by examiner

COMPONENT MOUNTER

TECHNICAL FIELD

The present disclosure relates to a component mounter.

BACKGROUND ART

Conventionally, there are known component mounters with a head attached to which are multiple nozzles that revolve around a main axis of the head. For example, the component mounter of patent literature 1 is provided with a raising and lowering member including a pressing roller positioned at a specified location in the revolving direction, and provided with a spring for biasing a nozzle upwards. With this component mounter, in a state with a nozzle positioned at a specified position, the nozzle is moved downwards by using the pressing roller to press a pressed section of the nozzle against the force of the spring. When the pressing by the pressing roller on the pressed section is released, the nozzle returns to the specified upper position due to the spring. The gap between adjacent pressed members is set such that the pressing roller cannot fit between them in a vertical direction.

CITATION LIST

Patent Literature

Patent literature 1: JP-A-2005-150638

SUMMARY

However, if a sudden failure occurs with the motor that raises and lowers the raising and lowering member, the power supporting the raising and lowering member is lost, and the raising and lowering member will fall. In patent literature 1, even if the raising and lowering member falls, because the gap between adjacent pressed sections is narrow, the pressing member rests on the pressed sections supported by the force of the spring. Thus, the raising and lowering member does not fall to a lowermost point.

However, as heads become smaller, pressed sections must also be made smaller, such that the gap between adjacent pressed sections becomes larger than the size of the pressing roller. In this case, if a raising and lowering member falls suddenly when the pressing roller is arranged above one of the gaps, the pressing roller will fit through the gap, meaning that the raising and lowering member will fall to the lowermost point. And, if the head moves in that state, the raising and lowering member may interfere with another component. Therefore, it is necessary to stop the raising and lowering member from falling suddenly.

The present disclosure solves the above problems, and an object thereof is to prevent a raising and lowering member falling suddenly in a component mounter with a small head.

A component mounter of the present disclosure includes:
a head to which multiple nozzles are attached so as to revolve around a center axis of the head;
a raising and lowering member provided with a pressing section at a specified position in a revolving direction; and
a biasing member configured to bias the nozzles upwards, wherein,
in a state with the nozzle positioned at the specified position,
the nozzle is pressed downwards by the pressing section pressing a pressed section of the nozzle against a force of the biasing member, and the nozzle is returned to a specified upper position due to the biasing member by the pressing section releasing pressing of the pressed section, further wherein
a gap between adjacent of the pressed sections is large enough for the pressing section to pass through in a vertical direction,
the nozzle includes a protruding section lower than the pressed section,
the raising and lowering member includes a regulating section arranged lower than the pressing section and between the pressed section and the protruding section of the nozzle, and
the regulating section has a size so as to be separated upwards from the protruding section when the pressing section is pressing the pressed section, and overlapping at least one of the protruding sections when viewed from above when the pressing section is positioned between the adjacent pressed sections.

With this component mounter, the gap between adjacent pressed sections is large enough such that the pressing section is able to pass through in a vertical direction. Therefore, the size of the pressed section can be made relatively small, meaning that the head can be made small. Also, because the regulating section is separated upwards from the protruding section when the pressing section is pressing the pressed section, there is no danger of pressing the protruding section. The regulating section has a size so as to overlap at least one of the protruding sections when viewed from above when the pressing section is positioned between the adjacent pressed sections. Therefore, in a state with the pressing section positioned above the gap between adjacent pressed sections, even if the raising and lowering member suddenly loses support and falls, the regulating section of the raising and lowering member engages with and stops the protruding section of the nozzle. In other words, the raising and lowering member is supported by the biasing member of the nozzle in a state with the regulating section of the raising and lowering member resting on the protruding section of the nozzle. Thus, sudden falling of the raising and lowering member is prevented.

In the component mounter of the present disclosure, the raising and lowering member may be raised and lowered by a linear motor. A linear motor is a motor that receives a supply of electricity and causes contactless movement using the magnetic force between a slider and a stator. Therefore, when the power is cut, the linear motor loses power to support the raising and lowering member, and the raising and lowering member falls. Therefore, application of the present disclosure is particularly effective.

With a component mounter of the present disclosure, the pressed section may be provided on a center axis of the nozzle. Thus, compared to a case in which the pressed member is provided at a position offset to the center axis of the nozzle, the pressing by the pressing section is performed smoothly even if the nozzle is small.

With a component mounter of the present disclosure, the pressed section may include a lip, and the regulating section may engage with a lower surface of the lip when the raising and lowering member is raised with respect to the nozzle. Accordingly, if for some reason the biasing means becomes unable to bias the nozzle up, it is possible to pull the nozzle up by the raising and lowering member being raised and engaging the regulating section with the lower surface of the lip.

With a component mounter of the present disclosure, the protruding section may be integrated as one with a gear used when rotating the nozzle around the center axis of the nozzle. Accordingly, compared to a case in which the gear and the protruding section are provided separately, the configuration of the nozzle is simple.

DESCRIPTION OF EMBODIMENTS

Figure 1:
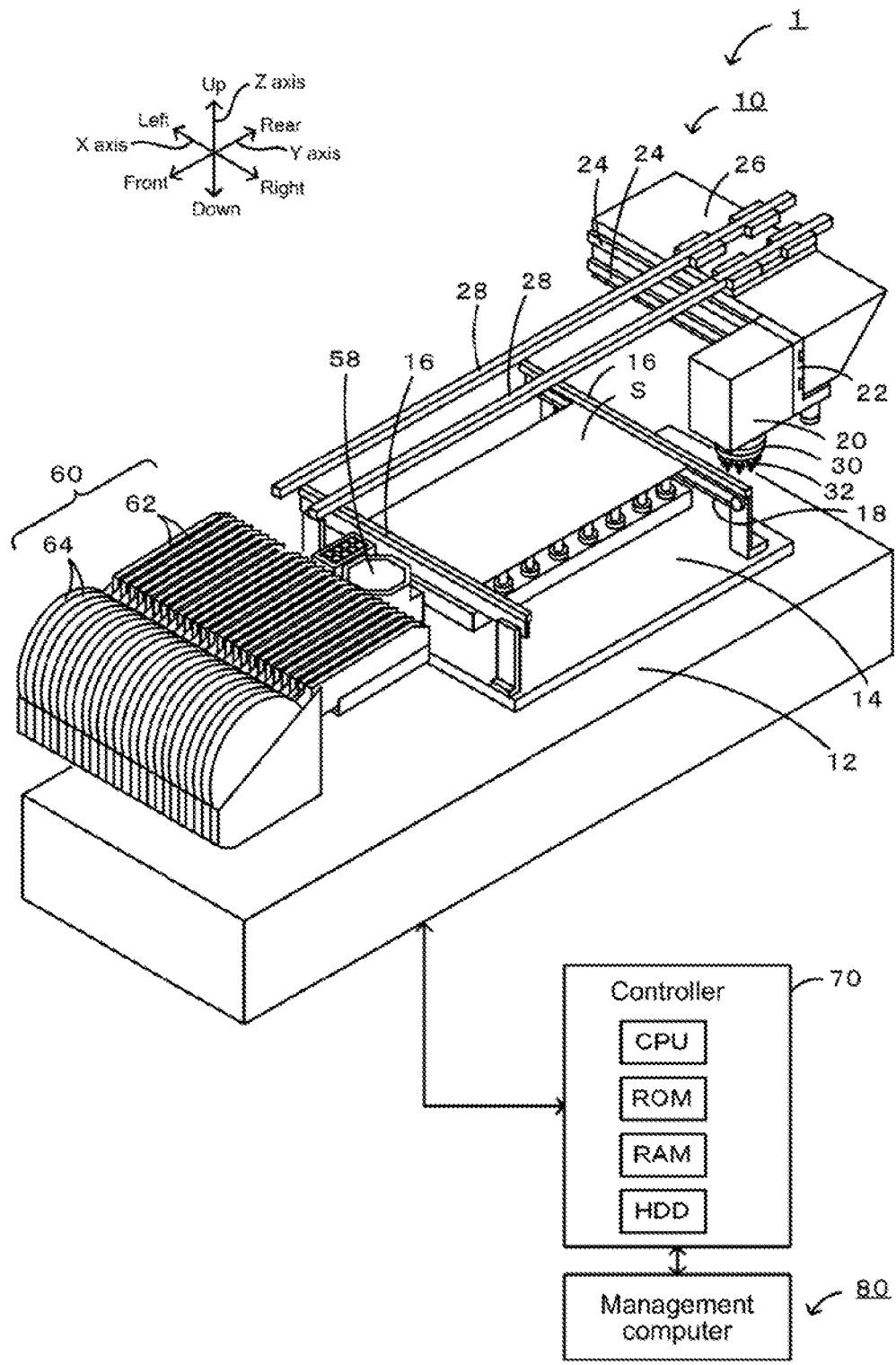
FIG. 1 shows the overall configuration of component mounting system 1.

Hereinafter, an embodiment of the present disclosure will be described with reference to the figures. FIG. 1 shows the overall configuration of component mounting system 1. In the present embodiment, left-right directions (X axis), front-rear directions (Y axis), and up-down directions (Z axis) are set as shown in FIG. 1.

Component mounting system 1 is provided with component mounter 10 and management computer 80.

As shown in FIG. 1, component mounter 10 is provided with board conveyance device 14 loaded on base 12, head unit 20 that can move in an XY plane, rotary head 30 that is removably attached to head unit 20, component camera 58 that captures an image from below of a component held by nozzle 32, component supply device 60 that supplies components to be mounted on board S, and controller 70 that performs various types of control.

Board conveyance device 14 conveys board S from left to right using conveyor belts 18 and 18 (only one of these is shown in FIG. 1) that are respectively attached to a pair of front/rear supporting plates 16 and 16.

Head unit 20 is attached to X-axis slider 22 and moves in a left-right direction with the left-right direction movement of X-axis slider 22 along guide rails 24 and 24, and moves in a front-rear direction with the front-rear movement of Y-axis slider 26 along guide rails 28 and 28. This allows head unit 20 to move in an XY plane. Sliders 22 and 26 are each driven by a servo motor that is not shown in the figures.

Rotary head 30 includes multiple nozzles 32 and is removably attached to head unit 20. Rotary head 30 is attached to head unit 20 so as to be rotatable around a center axis (an axis in the vertical direction).

Component camera 58 is arranged at the front side of board conveyance device 14. Component camera 58 captures an image of the state of the component held by nozzle 32 when nozzle 32 holding the component passes above component camera 58. The image captured by component camera 58 is used to determine, for example, whether the component has been picked up correctly.

Component supply device 60 is attached to the front of component mounter 10. Component supply device 60 has multiple slots and a feeder 62 can be inserted into each slot. Reel 64 around which tape is wound is attached to feeder 62. Components are held in the surface of the tape lined up in the lengthwise direction of the tape. The components are protected by a film that covers the surface of the tape. This tape is indexed to the rear by a sprocket mechanism which is not shown and the film is peeled off, such that the components are arranged at a specified component supply position in an exposed state. The component supply position is a position at which the component can be picked up by nozzle 32. Nozzle 32 that picks up a component at the component supply position mounts the component at a predetermined position on board S.

Controller 70 is provided with a CPU that performs various types of control, ROM that memorizes control programs and so on, RAM used as working memory, and an HDD that memorizes large amounts of data, and these are connected by a bus which is not shown. Controller 70 is connected to board conveyance device 14, X-axis slider 22, Y-axis slider 26, head unit 20, component camera 58, and component supply device 60 so as to be capable of exchanging signals with those items.

Management computer 80 manages the production job of board S, and memorizes production job data created by an operator. Defined in the production job data are: which components from feeders at which slot positions are to be mounted to which type of board S and in what order at component mounting device 10, how many of those boards S are to be manufactured, and so on. Management computer 80 is connected to controller 70 of component mounter 10 and controllers, which are not shown, of feeders 62 such that two-way communication is possible.

Figure 2:
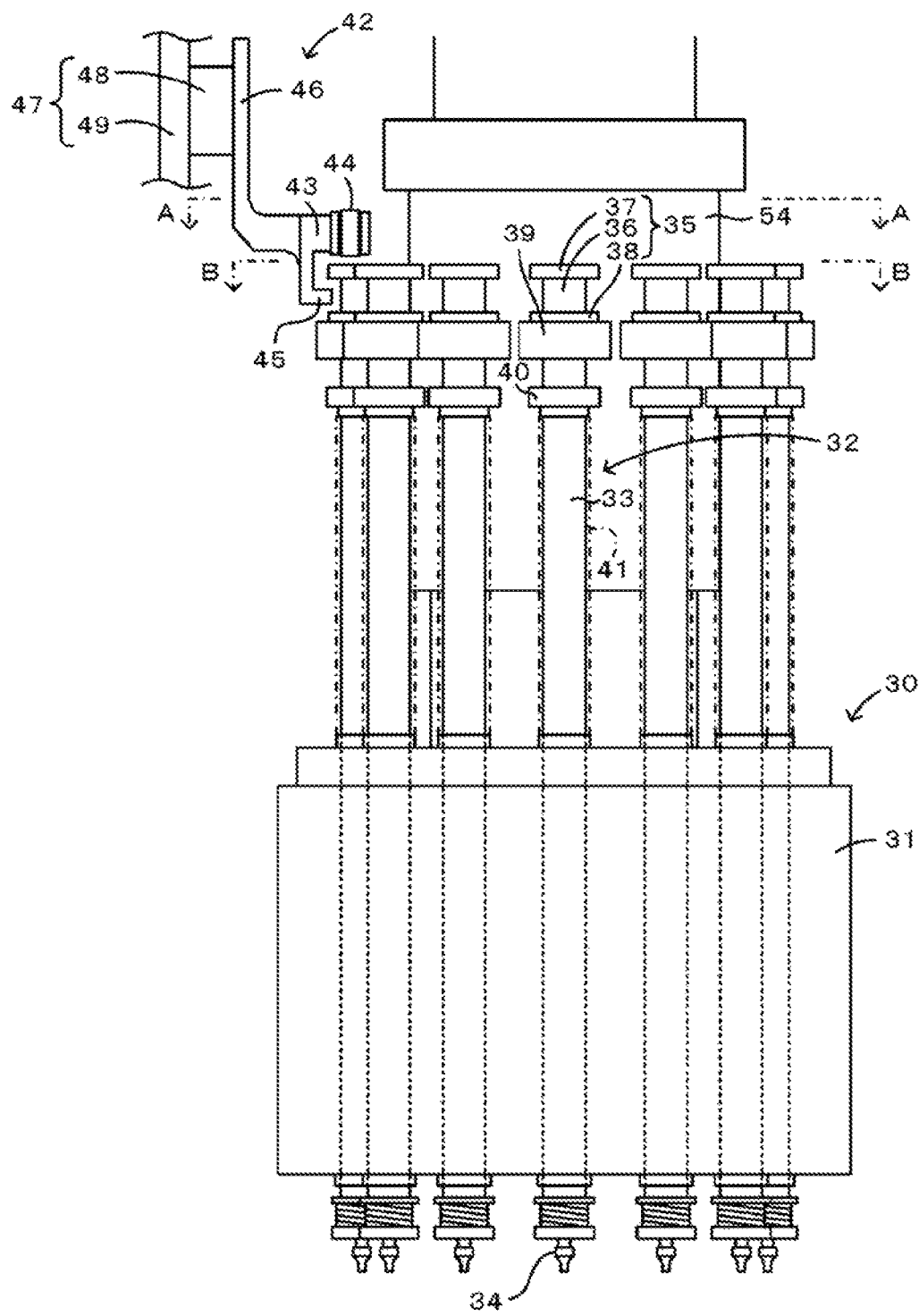
FIG. 2 is a front view of rotary head 30 and surrounding portions.
Figure 3:
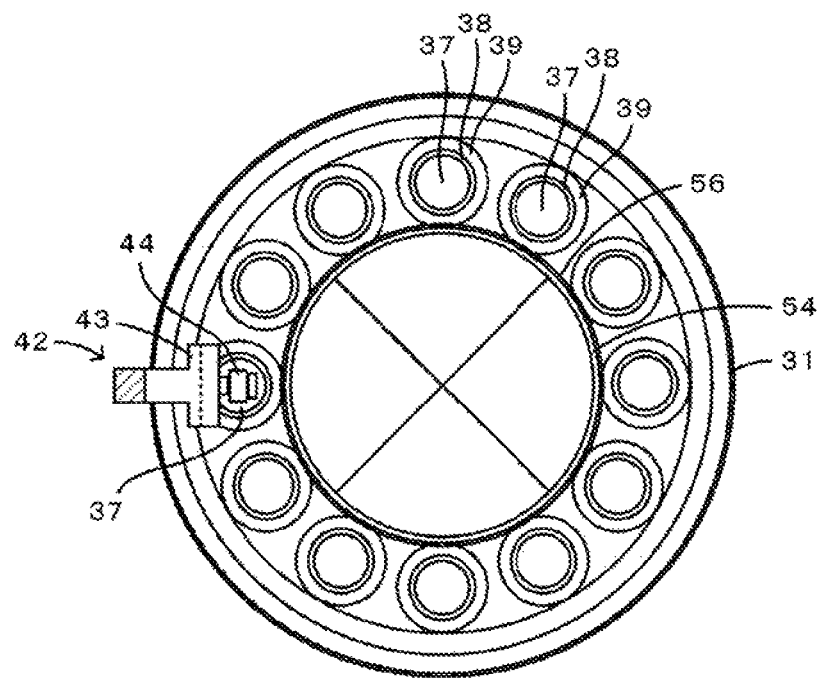
FIG. 3 is a cross section of A-A of FIG. 2.
Figure 4:
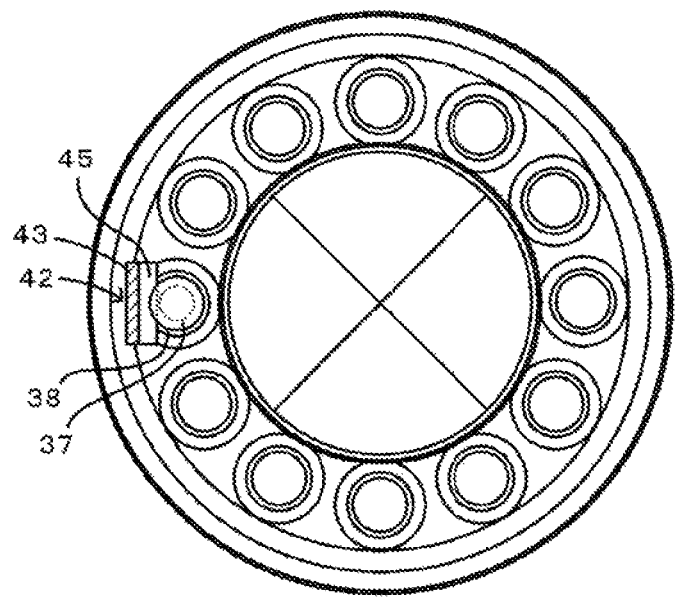
FIG. 4 is a cross section of B-B of FIG. 2.
Figure 5:
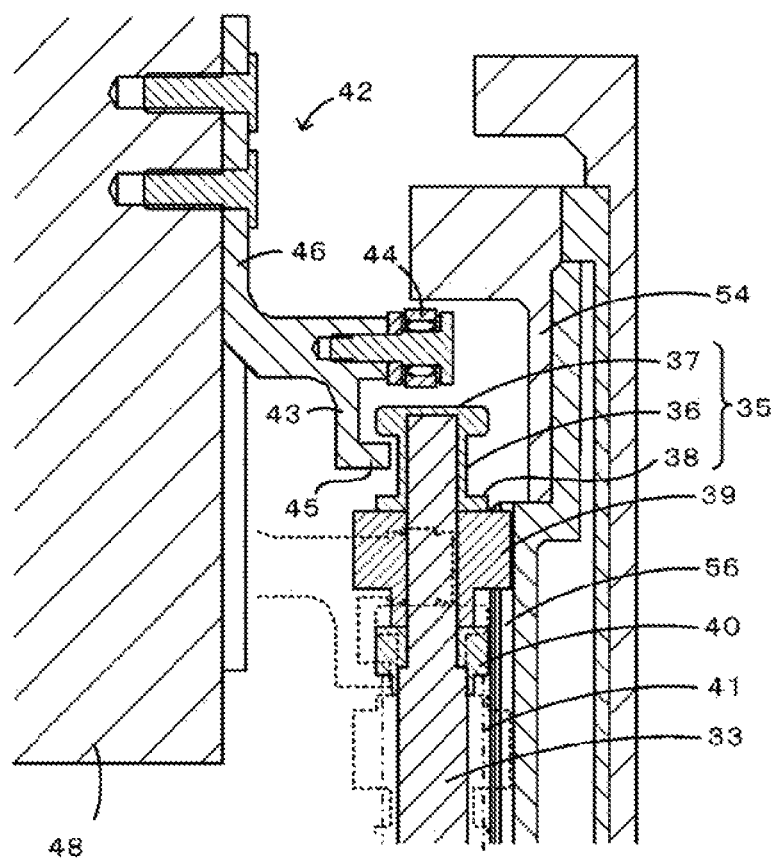
FIG. 5 is a cross section for illustrating operation of raising and lowering member 42.
Figure 6:
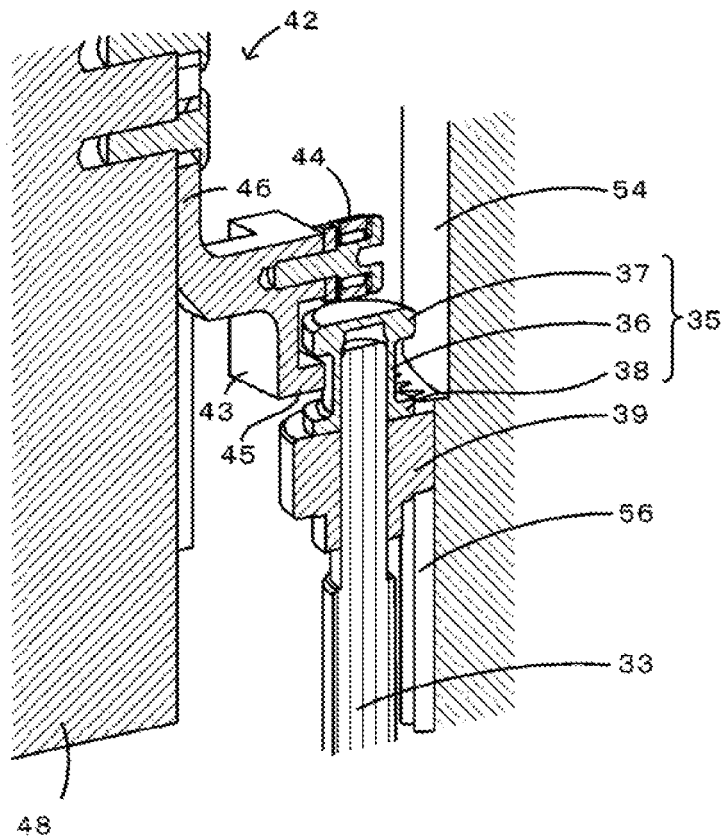
FIG. 6 is a cross section for illustrating operation of raising and lowering member 42.
Figure 7:
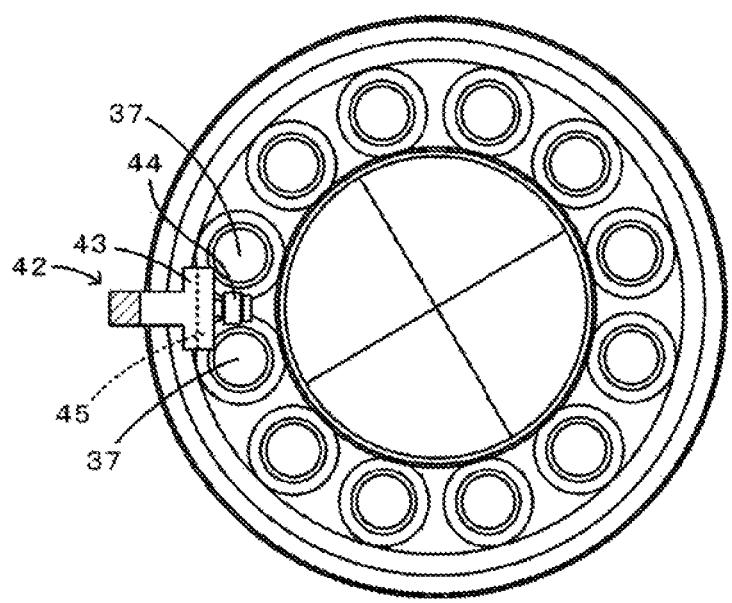
FIG. 7 is a cross section of A-A of FIG. 2 (corresponding to a plan view when pressing roller 44 is positioned between adjacent circular plate sections 37).

Next, details of rotary head 30 and surrounding members are described. FIG. 2 is a front view of rotary head 30 and surrounding members; FIG. 3 is a cross section of A-A of FIG. 2; FIG. 4 is a cross section of B-B of FIG. 2; and FIGS. 5 and 6 are for illustrating operation of raising and lowering member 42. FIG. 7 is a cross section of A-A of FIG. 2, corresponding to a plan view when pressing roller 44 is positioned between adjacent circular plate sections 37.

Rotary head 30 is provided with head main body 31 that is tubular and provided with a solid bottom and open at an upper surface, and multiple (here, twelve) nozzles 32 attached to an outer circumference of head main body 31 so as to be vertically movable.

Head main body 31 is removably held by head holding body 54 that is rod-shaped and attached to head unit 20. Specifically, head holding body 54 is inserted into the opening at the top surface of head main body 31, and an engaging section, which is not shown, provided on the bottom surface of head holding body 54 engages with an engaged section, which is not shown, provided on the bottom surface of the opening of head main body 31. Head holding body 54 is able to be rotated by a motor, which is not shown, provided on head unit 20. When head holding body 54 rotates, head main body 31 of rotary head 30 also rotates, meaning that the multiple nozzles 32 revolve around the main axis (center axis) of rotary head 30.

Nozzles 32 are provided on an outer surface of head main body 31 at even intervals. Nozzles 32 are provided with cylinder section 33 that extends in the vertical direction, and suction section 34 by which a component can be picked up. Cylinder section 33 is provided with cap 35 at a top end, and nozzle gear 39 provided below cap 35. Cap 35 includes circular plate section 37 on a top section of cap main body 36 that is cylindrical, and ring-shaped protrusion 38 that protrudes outwards in a diameter direction at a lower section of cap main body 36. Because the diameter of circular plate section 37 is larger than that of cap main body 36, the outer circumference of circular section 37 forms a lip. This circular section 37 is provided on a center axis of nozzle 32. The diameter of nozzle gear 39 is larger than that of circular plate section and ring-shaped protrusion 38, and engages with cylindrical gear 56 (refer to FIGS. 3, 5, and 6) attached to head holding body 54. Nozzle gear 39 is provided to contact ring-shaped protrusion 38 of cap 35. Cylindrical gear 56 is configured to rotate independently from head holding body 54 via a motor, which is not shown. Therefore, when cylindrical gear 56 rotates, nozzle gear 39 engaged with cylindrical gear 56 rotates, and nozzle 32 rotates on its own axis independently of head main body 31. Nozzle 32 includes spring receiving section 40, and is biased upwards by spring 41 provided between spring receiving section 40 and a spring receiving section, which is not shown, on the head main body 31 side. Suction section 34 uses pressure to pick up a component and release a held component. When the above cylinder section 33 of nozzle 32 is rotated on its own axis, pickup section 34 also rotates on its own axis. Therefore, for example, to change the orientation of a component held by suction section 34, it is sufficient to appropriately rotate cylindrical gear 56. Note that, spring receiving section 40 and spring 41 are omitted from FIG. 6.

Raising and lowering member 42 is attached to head unit 20 independently to rotary head 30 at a specified position in the revolving direction of nozzles 32. Raising and lowering member 42 is provided with bracket section 43 that has a C-shaped cross section, and L-shaped support section 46 provided integrally on the back surface of bracket section 43. Bracket section 43 includes pressing roller 44 on an upper side and horizontal protrusion 45 on a lower side. Pressing roller 44 is a ring that rolls via a bearing, and is used to press down on an upper surface of circular plate section 37 of nozzle 32. Further, as shown in FIG. 7, pressing roller 44 has a size that can pass through the gap between adjacent circular plate sections 37 of nozzles 32 in a vertical direction. In other words, the gap between adjacent circular plate sections 37 is large enough for pressing roller 44 to pass through in a vertical direction. Horizontal protrusion 45 is arranged between circular plate section 37 and ring-shaped protrusion 38 of nozzle 32, and is configured to engage with the lower surface of a lip of circular plate 37 when raising and lowering member 42 is raised with respect to nozzle 32. In a state with pressing roller 44 contacting circular plate section 37 of nozzle 32, horizontal protrusion 45 is separated from ring-shaped protrusion 38 in an upwards direction. Further, as shown in FIG. 7, horizontal protrusion 45 has a size so as to overlap with one or both of adjacent ring-shaped protrusions 38 of nozzle 32 when viewed from above in a case in which pressing roller 44 is positioned between adjacent circular plate sections 37 of nozzles 32. L-shaped support section 46 is provided integrally with slider 48 of Z-axis linear actuator 47. Therefore, raising and lowering member 42 is able to be moved in a vertical direction by Z-axis linear actuator 47.

As shown in FIG. 2, Z-axis linear actuator 47 is provided with slider 48 and stator 49. Slide 48 has an in-built coil that is an electromagnet. Slider 48 is vertically movable in a state guided by a linear guide, which is not shown. Stator 49 has multiple N and S poles arranged alternately. With Z-axis linear actuator 47 configured in this manner, when electric current flows through the coil of slider 48, slider 48 moves vertically along the linear guide due to the pushing and pulling effects between the magnets of stator 49 and the magnetic field generated by the coil.

Next, descriptions will be given of operations of controller 70 of component mounter 10 in which head unit 20 mounts components on board S based on production job data received from management computer 80. Here, twelve nozzles 32 are attached in order from number one to number twelve.

First, controller 70 causes suction section 34 of nozzle 32 to pick up a component. Specifically, controller 70, in a state with circular plate section 37 of first nozzle 32 positioned directly below pressing roller 44 (refer to the solid lines in FIG. 5), controls X-axis slider 22 and Y-axis slider 26 such that first nozzle 32 is arranged directly above the target component. Then, controller 70 controls Z-axis linear actuator 47 such that the upper surface of circular plate section 37 of first nozzle 32 is pressed down against the force of spring 41 by pressing roller 44 of raising and lowering member 42 (refer to the dotted lines of FIG. 5). Thus, suction section 34 of first nozzle 32 is lowered. Along with this, negative pressure is supplied to suction section 34 of first nozzle 32. By this, suction section 34 of first nozzle 32 picks up the target component. Note that, horizontal protrusion 45, when pressing roller 44 is pressing down circular plate section 37 of nozzle 32, is separated from ring-shaped protrusion 38 of nozzle 32 in the upwards direction, so does not push down ring-shaped protrusion 38.

Next, controller 70 rotates head holding body 54 and rotary head 30. Controller 70, while rotary head 30 is rotating, controls Z-axis linear actuator 47 to raise pressing roller 44 such that first nozzle 32 returns to a specified position (the position of FIG. 2) due to the force of spring 41. Continuing, controller 70 rotates rotary head 30 further, and during rotation, controls Z-axis linear actuator 47 to lower pressing roller 44 to press down on second nozzle 32 against the force of spring 41. Along with this, negative pressure is supplied to suction section 34 of second nozzle 32. Here, controller 70 performs control such that suction section 34 of second nozzle 34 picks up the target component. By this, suction section 34 of second nozzle 32 picks up the target component. Note that, horizontal protrusion 45 of raising and lowering member 42 is configured with a size such that while rotary head 30 is rotating, horizontal protrusion 45 does not interfere with nozzle gear 39 or ring-shaped protrusion 38 of suction 32 other than the operation target. Similar operations are repeated for the third nozzle 32 onward. By this, components are picked up by all the nozzles 32, from the first to the last.

Subsequently, controller 70 controls sliders 22 and 24 and head unit 20 so as to mount the component at a target position on board S. Specifically, controller 70 controls X-axis slider 22 and Y-axis slider 26 to move head unit 20 such that first nozzle 32 is directly above the target position of the component. Also, during the above operation, rotary head 30 is rotated such that circular plate section 37 of first nozzle 32 is arranged directly below pressing roller 44. Then, at the target position of the first component, controller 70 controls Z-axis linear actuator such that first nozzle 32 is lowered by pressing roller 44, and then supplies atmospheric pressure to first nozzle 32. Thus, the component held by first nozzle 32 is mounted at the target position of the first component. Similar operations are performed for each of the components held by subsequent nozzles 32 such that the components are mounted on board S.

Figure 8:
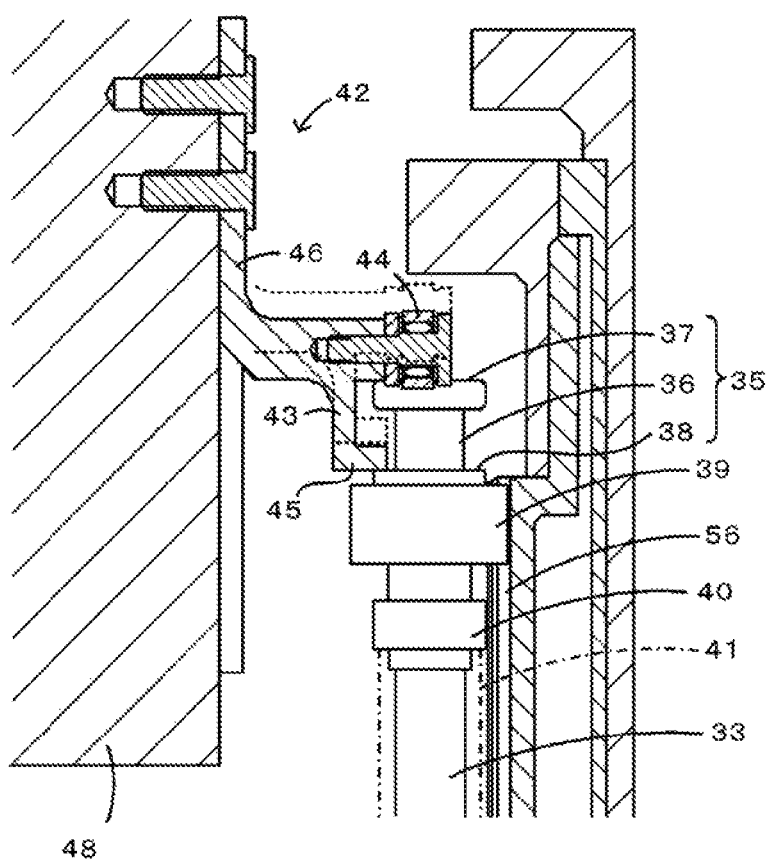
FIG. 8 is a cross section for illustrating operation of raising and lowering member 42.

Described next is a case in which power to Z-axis linear actuator 47 is cut. If power to Z-axis linear actuator 47 is cut, because the magnetic field due to the coil ceases to exist, raising and lowering member 42 falls with slider 48 due to its own weight. At this time, as shown in FIG. 3, if pressing roller 44 is contacting circular plate section 37 of nozzle 32, pressing roller 44 is caught by circular plate section 37, and raising and lowering member 42 is stopped at that position by the force of spring 41 of nozzle 32, and does not fall further. On the other hand, as shown in FIG. 7, if pressing roller 44 is positioned between adjacent circular plate sections 37 of nozzles 32, pressing roller 44 does not get stopped by circular plate section 37. However, in such a case, horizontal protrusion 45 of raising and lowering member 42 is configured so as to be stopped by one or both of adjacent ring-shaped protrusions 38 of nozzles 32. Therefore, as shown by the solid lines in FIG. 8, horizontal protrusion 45 is stopped by ring-shaped protrusion 8, and raising and lowering member 42 is stopped at that position by the force of spring 41 of nozzle 32, and does not fall further. Note that, the dotted lines in FIG. 8 show a state in which raising and lowering member 42 is stopped at an initial position being supported by Z-axis linear actuator 47.

Correspondences between constituent elements of the present embodiment and constituent elements of the disclosure will be clarified here. Rotary head 30 of the embodiment corresponds to a head of the present disclosure, pressing roller 44 corresponds to a pressing section, spring 41 corresponds to a biasing member, an upper surface of circular plate section 37 of nozzle 32 corresponds to a pressed section, ring-shaped protrusion 38 of nozzle 32 corresponds to a protruding section, and horizontal protrusion 45 of raising and lowering member 42 corresponds to a regulating section. Also, Z-axis linear actuator 47 corresponds to a linear motor.

According to component mounter 10 of the embodiments described above, because the gap between adjacent circular plate sections 37 of suction nozzles 32 is large enough for pressing roller 44 to pass through in a vertical direction, it is possible to make circular plate section 37 relatively small, such that rotary head 30 can be made small. Also, horizontal protrusion 45 of raising and lowering member 42, when pressing roller 44 is pressing down circular plate section 37 of nozzle 32, is separated from ring-shaped protrusion 38 of nozzle 32 in the upwards direction, so does not push down ring-shaped protrusion 38. Horizontal protrusion 45 has a size so as to overlap with one or both of adjacent ring-shaped protrusions 38 of nozzle 32 when viewed from above in a case in which pressing roller 44 is positioned between adjacent circular plate sections 37 of nozzles 32. Therefore, in a state with the pressing roller 44 positioned above the gap between adjacent circular plate sections 37 of nozzles 32, even if power to Z-axis linear actuator 47 is cut such that raising and lowering member 42 suddenly loses support and falls, horizontal protrusion 45 of raising and lowering member 42 engages with and stops ring-shaped protrusion 38 of nozzle 32. In other words, horizontal protrusion 45 of raising and lowering member 42 is supported by spring 41 of nozzle 32 in a state with the horizontal protrusion 45 of raising and lowering member 42 resting on ring-shaped protrusion 38 of nozzle 32. Thus, sudden falling of the raising and lowering member is prevented.

Also, because Z-axis linear actuator that raises and lowers raising and lowering member 42 is a motor that moves that receives a supply of electricity and causes contactless movement using the magnetic force between slider 48 and stator 49, when the power is cut, power to support raising and lowering member 42 is lost, so raising and lowering member falls. Therefore, application of the present disclosure is particularly effective.

Further, because circular plate section 37 of nozzle 32 pressed by pressing roller 44 is provided above the center axis of nozzle 32, compared to a case in which circular plate section 37 is provided at a position offset to the center axis of nozzle 32, the pressing by pressing roller 44 is performed smoothly even if nozzle 32 is small.

And, if the biasing upwards of nozzle 32 is lost, for example, by spring 41 being damaged, nozzle 32 can be pulled up by raising and lowering member 42 being raised and engaging with the lower surface of the lip of circular plate section 37 of nozzle 32.

Meanwhile, it goes without saying that the disclosure is not limited to the above-mentioned embodiment and various embodiments may be applied within the technical scope of the disclosure.

For example, in an embodiment above, ring-shaped protrusion 38 is provided separately to nozzle gear 39, however, nozzle gear 39 may be used as a ring-shaped protrusion without providing ring-shaped protrusion 38. In other words, the ring-shaped protrusion may be integrated with nozzle gear 39. In this case, compared to a case in which ring-shaped protrusion 38 and nozzle gear 39 are provided separately, nozzle 32 can be made more compact.

In an embodiment above, cap 35 is provided on cylinder section 33 of nozzle 32, but cap 35 does not have to be provided, circular plate section 37 and ring-shaped protrusion 38 may be formed directly on cylinder section 33.

In an embodiment above, an example of rotary head 30 with twelve nozzles 32 is given, but the quantity of nozzles 32 is not particularly limited. For example, there may be four, eight, or sixteen.

In an embodiment above, pressing roller 44 is used as a pressing section, but a pressing rod may be used instead of pressing roller 44. However, it is desirable to use pressing roller 44 to prevent large friction occurring during pressing when circular plate section 37 of nozzle 32 is pressed downwards while rotary head 30 is being rotated.

In an embodiment above, component supply device 60 supplies reel components, but an item supplying tray components or bulk components may be used.

INDUSTRIAL APPLICABILITY

The present disclosure may be applied, for example, to a component mounter or a component mounting system including a component mounter.

REFERENCE SIGNS LIST

1: component mounting system; 10: component mounter; 12: base; 14: board conveyance device; 16: support plate; 18: conveyor belt; 20: head unit; 22: X-axis slider; 24: guide rail; 26: Y-axis slider; 28: guide rail; 30: rotary head; 31: head main body; 32: nozzle; 33: cylinder section; 34: suction section; 35: cap; 36: cap main body; 37: circular plate section; 38: ring-shaped protrusion; 39: nozzle gear; 40: spring receiving section; 41: spring; 42: raising and lowering member; 43: bracket section; 44: pressing roller; 45: horizontal protrusion; 46: support section; 47: Z-axis linear actuator; 48: slider; 49: stator; 54: head holding body; 56: cylindrical gear; 58: component camera; 60: component supply device; 62: feeder; 64: reel; 70: controller; 80: management computer

The invention claimed is:

1. A component mounter comprising:
a head to which multiple nozzles are attached so as to revolve around a main axis of the head;
a raising and lowering member provided with a pressing section at a specified position in a revolving direction; and a biasing member configured to bias the nozzles upwards, wherein, in a state with the nozzle positioned at the specified position, the nozzle is pressed downwards by the pressing section pressing a pressed section of the nozzle against a force of the biasing member, and the nozzle is returned to a specified upper position due to the biasing member by the pressing section releasing pressing of the pressed section, further wherein a gap between adjacent of the pressed sections is large enough for the pressing section to pass through in a vertical direction, the nozzle includes a protruding section lower than the pressed section, the raising and lowering member includes a regulating section arranged lower than the pressing section and between the pressed section and the protruding section of the nozzle, and the regulating section has a size so as to be separated upwards from the protruding section when the pressing section is pressing the pressed section, and overlapping at least one of the protruding sections when viewed from above when the pressing section is positioned between the adjacent pressed sections.

2. The component mounter according to claim 1, wherein the raising and lowering member is, raised and lowered by a linear motor.

3. The component mounter according to claim 1, wherein the pressed section is provided on a center axis of the nozzle.

4. The component mounter according to claim 1, wherein the pressed section includes a lip, and the regulating section engages with a lower surface of the lip when the raising and lowering member is raised with respect to the nozzle.

5. The component mounter according to claim 1, wherein the protruding section is integrated as one with a gear used when rotating the nozzle around the center axis of the nozzle.

* * * * *